(12) United States Patent
Lien et al.

(10) Patent No.: US 6,278,162 B1
(45) Date of Patent: *Aug. 21, 2001

(54) ESD PROTECTION FOR LDD DEVICES

(75) Inventors: Chuen-Der Lien, Mountain View; Paul Y. M. Shy, Cupertino, both of CA (US)

(73) Assignee: Integrated Device Technology, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/342,781

(22) Filed: Nov. 21, 1994

Related U.S. Application Data

(63) Continuation of application No. 08/085,611, filed on Jun. 30, 1993, now abandoned.

(51) Int. Cl.$^7$ .................................................. H01L 29/76
(52) U.S. Cl. ................................. 257/408; 438/286
(58) Field of Search .................................. 257/408, 355, 257/401, 653; 438/286

(56) References Cited

U.S. PATENT DOCUMENTS

| | | | |
|---|---|---|---|
| 4,005,450 | * | 1/1977 | Yoshida et al. .................. 257/408 |
| 4,404,579 | * | 9/1983 | Leuschner ......................... 257/387 |
| 4,978,628 | * | 12/1990 | Rosenthal .......................... 438/286 |
| 5,132,753 | * | 7/1992 | Chang et al. ....................... 257/408 |
| 5,337,274 | * | 8/1994 | Ohji .................................. 257/408 |
| 5,349,225 | * | 9/1994 | Redwine et al. ................... 257/408 |
| 5,422,506 | * | 6/1995 | Zamapian .......................... 257/408 |
| 5,426,327 | * | 6/1995 | Murai ................................ 257/408 |
| 5,436,482 | * | 7/1995 | Ogoh ................................. 257/408 |
| 5,512,769 | * | 4/1996 | Yamamoto ......................... 257/408 |
| 5,714,783 | * | 2/1998 | Duvvury ............................ 257/335 |
| 5,793,086 | * | 8/1998 | Ghio et al .......................... 257/390 |
| 5,894,158 | * | 4/1999 | Wei ................................... 257/408 |

FOREIGN PATENT DOCUMENTS

| | | | |
|---|---|---|---|
| 6437055 | * | 2/1989 | (JP) ................................. 257/408 |
| Heisei 1-182947 | | 2/1991 | (JP) . |
| 0346372 | * | 2/1991 | (JP) ................................. 257/408 |

* cited by examiner

*Primary Examiner*—Mark V. Prenty
(74) *Attorney, Agent, or Firm*—Isabelle R. McAndrews

(57) ABSTRACT

A semiconductor integrated circuit suitable for use in an ESD protection circuit is disclosed. A substrate has an active region formed therein so as to define a P/N junction therebetween. An insulating region is formed near the surface of the substrate adjacent the active region thus defining an edge therewith. The active region includes a highly doped portion formed near the surface of the substrate and near the edge of the insulating region and a lightly doped portion formed below the highly doped portion and separated from the edge of the insulating portion. By moving the highly doped portion of the active region away from the insulating region, the P/N junction is effectively moved away from the insulating region.

14 Claims, 11 Drawing Sheets

ESD PROTECTION FOR LDD DEVICES

This is a continuation of Application Ser. No. 08/085,611, filed Jun. 30, 1993 now abandoned.

FIELD OF THE INVENTION

The present invention relates to circuits for protecting against electrostatic discharge ("EDS"), and more particularly, to a semiconductor integrated circuit having a lightly doped drain ("LDD") profile which is useful for ESD protection.

BACKGROUND

It is well known that electrostatic discharge ("ESD") can damage an integrated circuit ("IC") during handling. Therefore, it is common to connect an ESD protection devices to the input/output ("I/O") pads of an IC to protect them from ESD damage.

During an ESD test, charges flow from an external capacitor to the I/O pads. In order to minimize the energy consumed by the ESD protection devices, the turn-on voltage of the ESD devices needs to be as low as possible. However, the turn-on voltage of the ESD protection devices has to be higher than the applied voltage Vcc during normal operation.

FIGS. 1a–1d illustrate examples of ESD protection devices as used in the semiconductor industry. FIG. 1a shows an input ESD device 10a consisting of an N-field transistor 12, a resistor 14, and a ground gate NMOS transistor 16a. During the ESD test, the N-field transistor 12 consumes most of the energy. The ground gate NMOS transistor 16a maintains the voltage low on the input buffer 18 to avoid damaging the input buffer 18.

In some cases, the field transistor can be replaced by a large NMOS transistor. In such a case, the ESD device consists of a large NMOS transistor, a resistor, and a small NMOS transistor.

Another variation of the ESD protection uses one NMOS transistor instead of two. FIG. 1b shows an NMOS transistor instead of two. FIG. 1b shows an NMOS transistor 16b with its gate grounded directly to Vss. FIG. 1c shows NMOS transistor 16b with its gate grounded through an inverter 20. A resistor may optionally be connected between the NMOS transistor 16b and the pad, shown in the figures as a dotted line connection. The NMOS transistor 16b needs to consume all of the ESD energy while maintaining a low voltage on the input buffer 18 during the ESD test.

In the case of output pad protection, active output devices also provide ESD protection. FIG. 1d shows a typical output buffer configuration with a pull-up MOS transistor 22 (either PMOS or NMOS) and a pull-down NMOS transistor 24 used for normal circuit operation and for ESD protection. This output structure can also be used for input ESD protection.

Lightly doped drains can be added to a standard process for fabricating source/drain regions by adding a low dose of phosphorus.

Cross-sectional views of a field transistor and an NMOS transistor are shown in FIGS. 2a and 2b, respectively. The N-region in both figures is provided by an LDD phosphorus implantation. Due to the gradual profile of phosphorus, breakdown voltages of an LDD N+/P− well junction and a ground gate NMOS are increased. This increases the initial turn-on voltage of these devices, which degrades the ESD protection capability of such devices. On the other hand, a lightly doped phosphorus dopant advantageously decreases the N+/P− well capacitance, thereby improving the speed of the device.

The present invention is directed to a semiconductor integrated circuit for use in an ESD protection circuit. A substrate has an active region formed therein so as to define a P/N junction therebetween. An insulating region is formed near the surface of the substrate adjacent the active region thus defining an edge therewith. The active region includes a highly doped portion formed near the surface of the substrate and near the edge of the insulating region and a lightly doped portion formed below the highly doped portion and separated from the edge of the insulating portion. By moving the lightly doped portion of the active region away from the insulating region, the P/N junction is effectively moved away from the insulating region.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

According to the present invention, the doping profile of some portions of the N+ source/drain regions are changed to decrease the breakdown voltage thereby improving ESD, and/or to modify the location of a P/N junction thereby reducing the electrical field at a weak place in the ESD structure. Further, the capacitance of the structure is not increased significantly.

The present invention may be realized by modifying the conventional N-LDD mask, as discussed below. That is, there is no additional masking step added. In fact, there is no additional process step in the process flow when compared with a conventional LDD process. Thus, without introducing any new process steps, we have improved ESD protection of semiconductor devices through modifications of the N-LDD mask while maintaining the junction capacitance as low as possible.

Figure 3A:
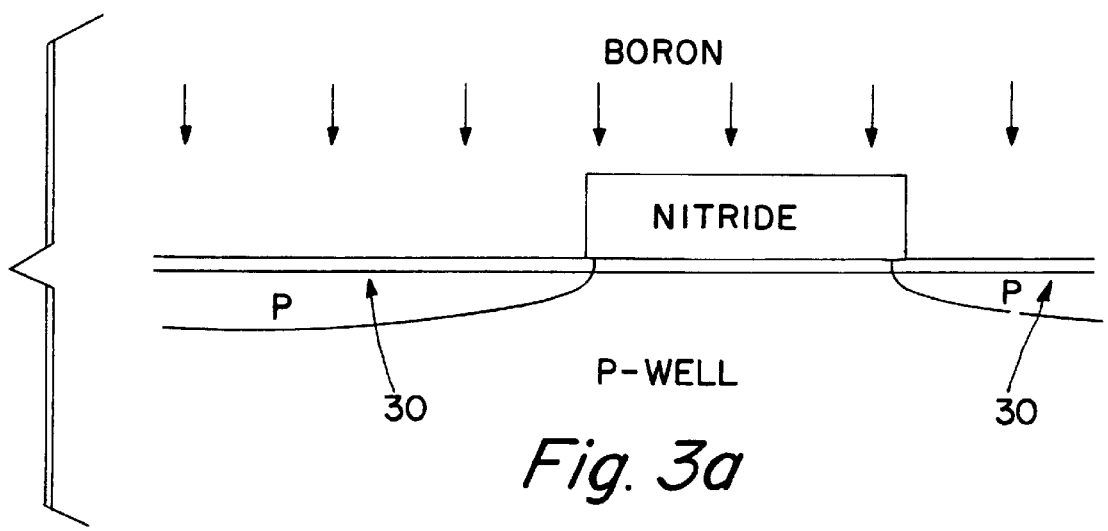
FIGS. 3a–3d illustrate a cross sectional series of steps for fabricating a P/N junction according to one embodiment of the present invention.
Figure 3B:
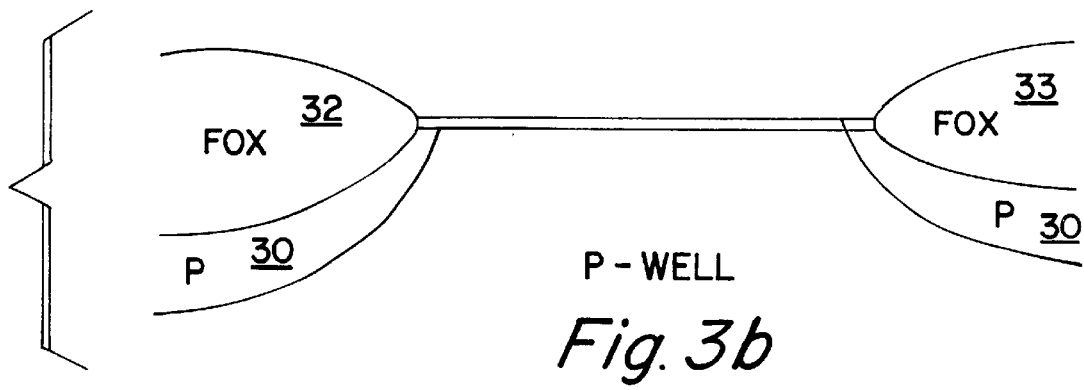
Figure 3C:
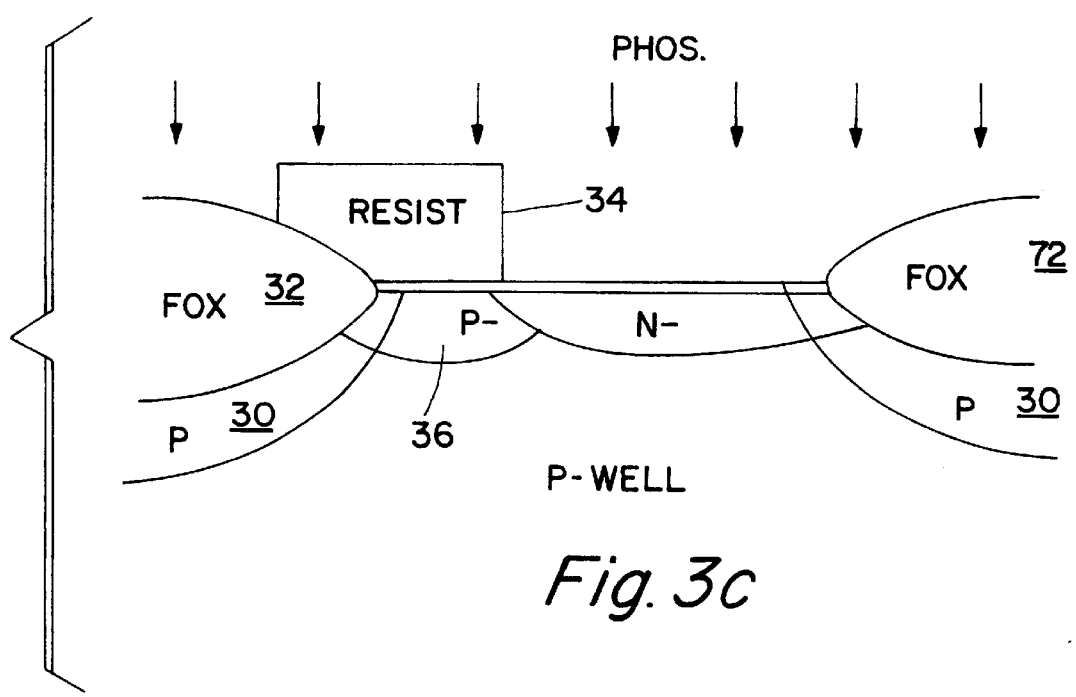
Figure 3D:
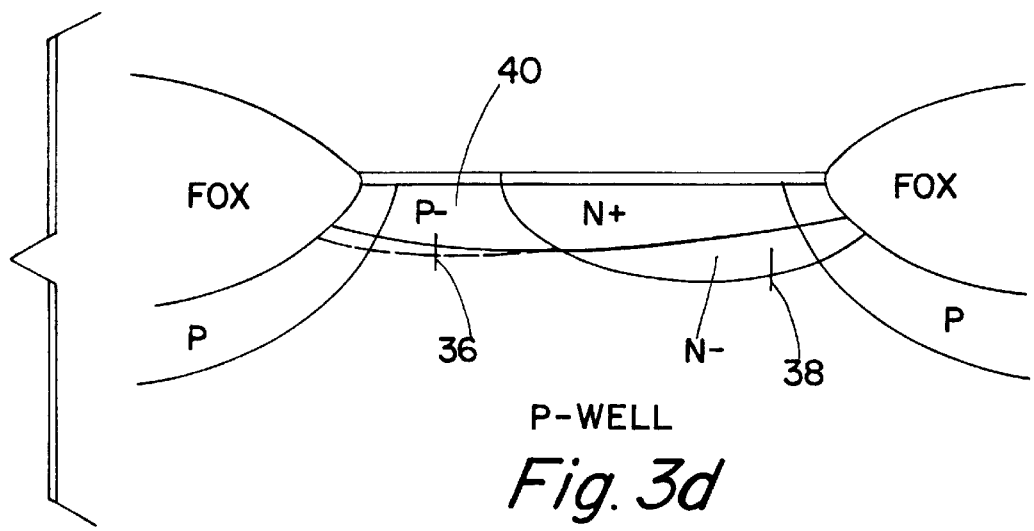

FIGS. 3a–3d show how an N+/P-well junction may be formed in accordance with one aspect of the invention. The steps shown in FIGS. 3a and 3b are conventional LDD process steps, wherein boron is implanted to form the doped regions 30, then the field oxide regions 32 are formed using for example, a LOCOS process. According to the present invention, a photoresist layer 34 is formed and patterned to block dopant from entering into area 35, as shown in FIG. 3c. Thus, when an N-type dopant is subsequently implanted, a gap will be formed between the P-region and the N-region. In an alternative embodiment, the interface of an N+ region and a p-well is modified by changing the mask used for providing the N-dopant. FIG. 3d illustrates the structure obtained by implementing this embodiment, wherein one edge of the N+/P-well does not contact the N-region 38, resulting in the breakdown voltage in area 35 being reduced.

The manner in which the structure shown in FIGS. 3c and 3d was formed, specifically the N+/P-well junction in accordance with the present invention, is described in more detail below. In FIG. 3c, P-well 30 and field oxidation regions 32A and 32B are formed as shown in FIGS. 3a and 3b. A photoresist layer is then disposed above the top surface of the substrate 33 and patterned to create mask 34. After etching, photoresist mask 34 remains covering a portion of field oxide 32A and gate oxide layer 31. A dopant of opposite conductivity to the well region is implanted beneath oxide layer 31, adjacent to area 36. Subsequently, a heavier dose of dopant is implanted to reside in the upper portion of region 38. The resulting structure is a heavily doped region in a substrate, having a lightly doped region beneath the heavily doped region.

Figure 4A:
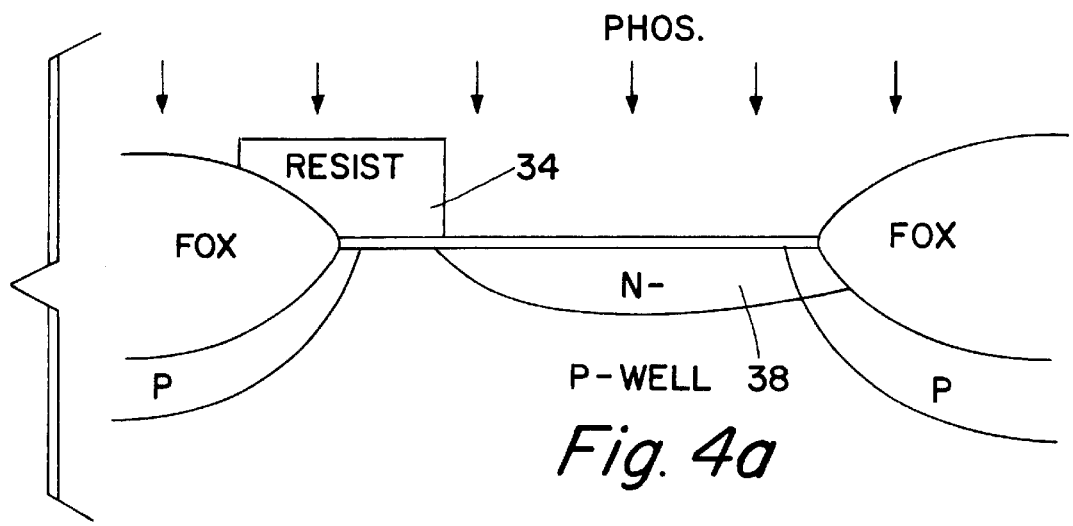
FIGS. 4A and 4b illustrate in cross section a process for fabricating an NMOS device according to one embodiment of the present invention.
Figure 4B:
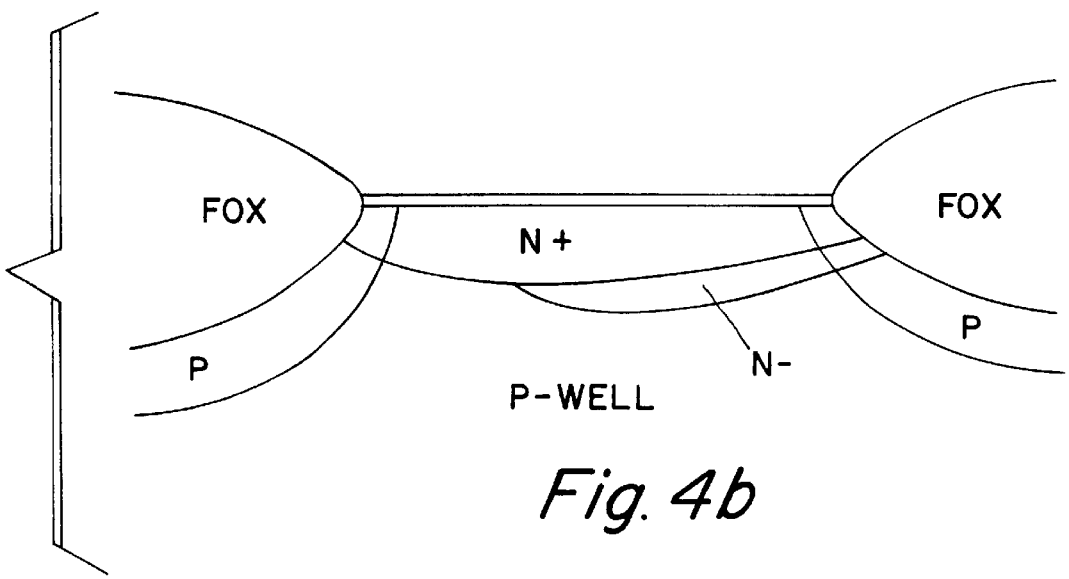

FIGS. 4a and 4b are similar to the process shown in FIGS. 3a–3d, but differ by excluding a lightly doped region of opposite conductivity in area 35.

Figure 5A:
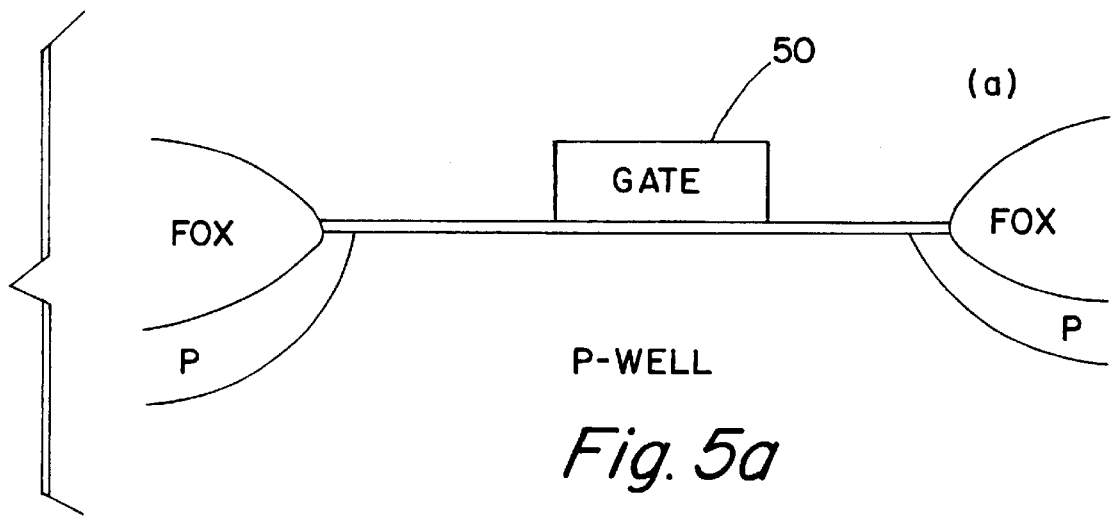
FIGS. 5a–5d illustrate one embodiment of the invention for forming a lightly doped drain.
Figure 5B:
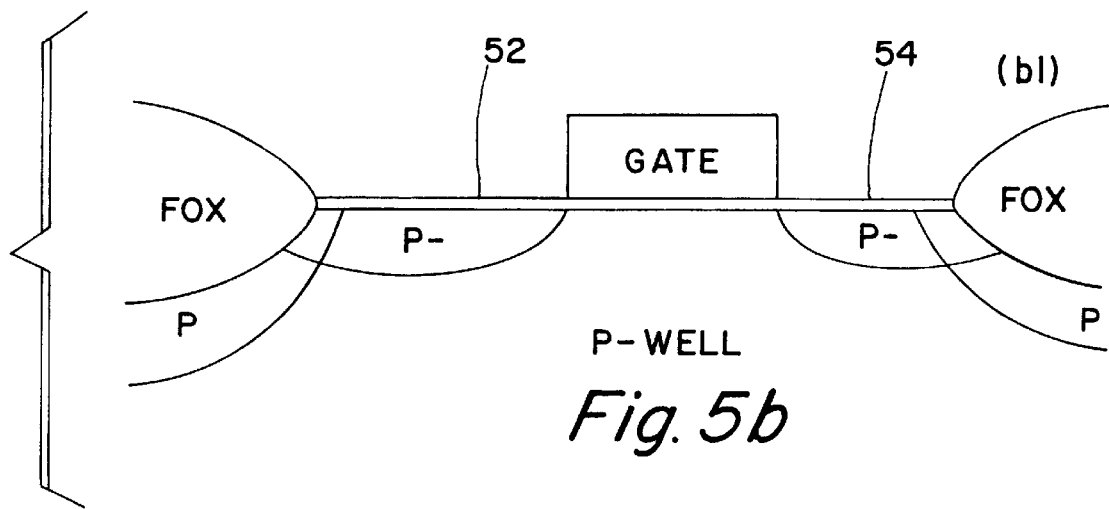

FIGS. 5a and 5b show a similar field edge modification for an NMOS drain junction. The P-regions 52 and 54 are formed prior to disposing photoresist 56 on the substrate. The photoresist 56 is patterned as a phosphorus implantation is then provided creating N-regions 58.

Figure 1A:
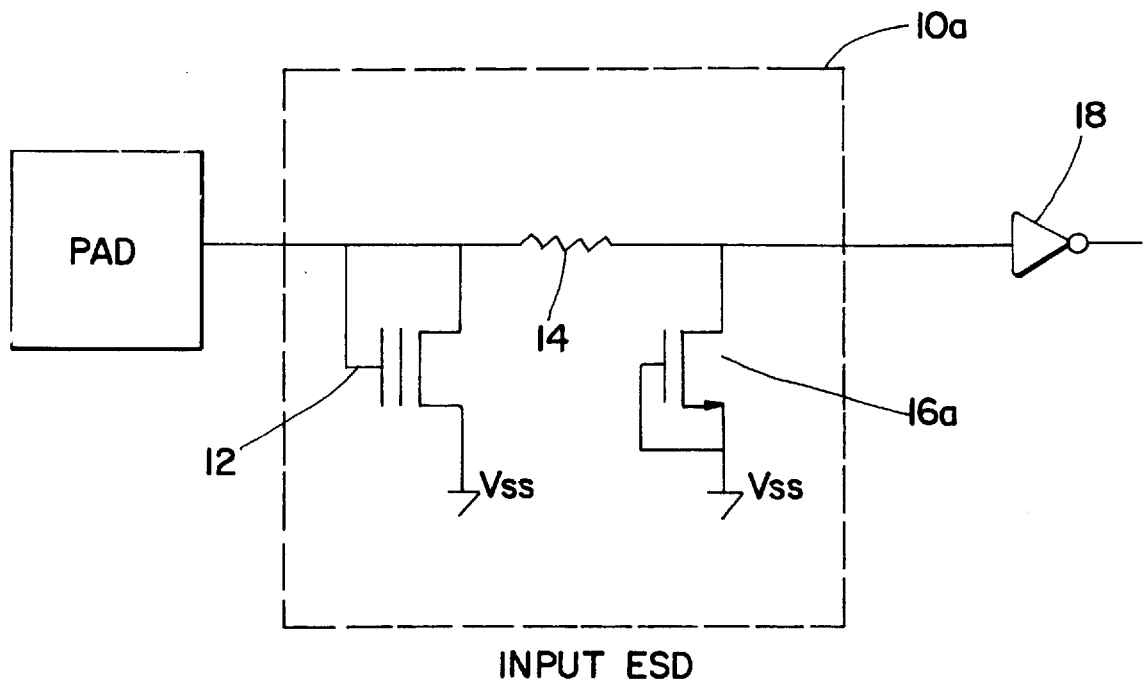
FIGS. 1a–1d are schematic diagrams of various ESD protection devices according to the prior art.
Figure 1B:
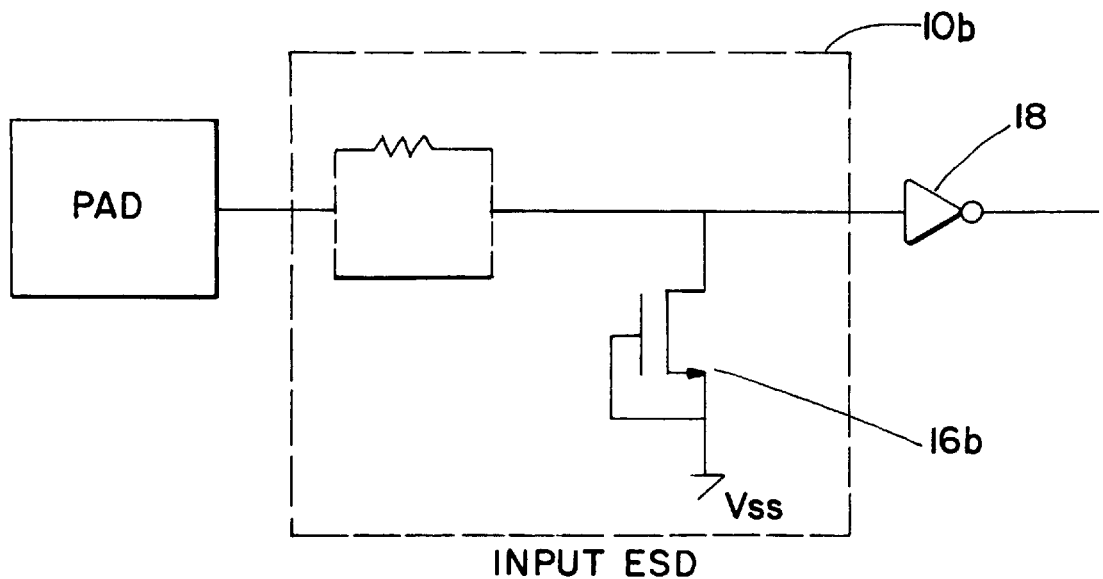
Figure 1C:
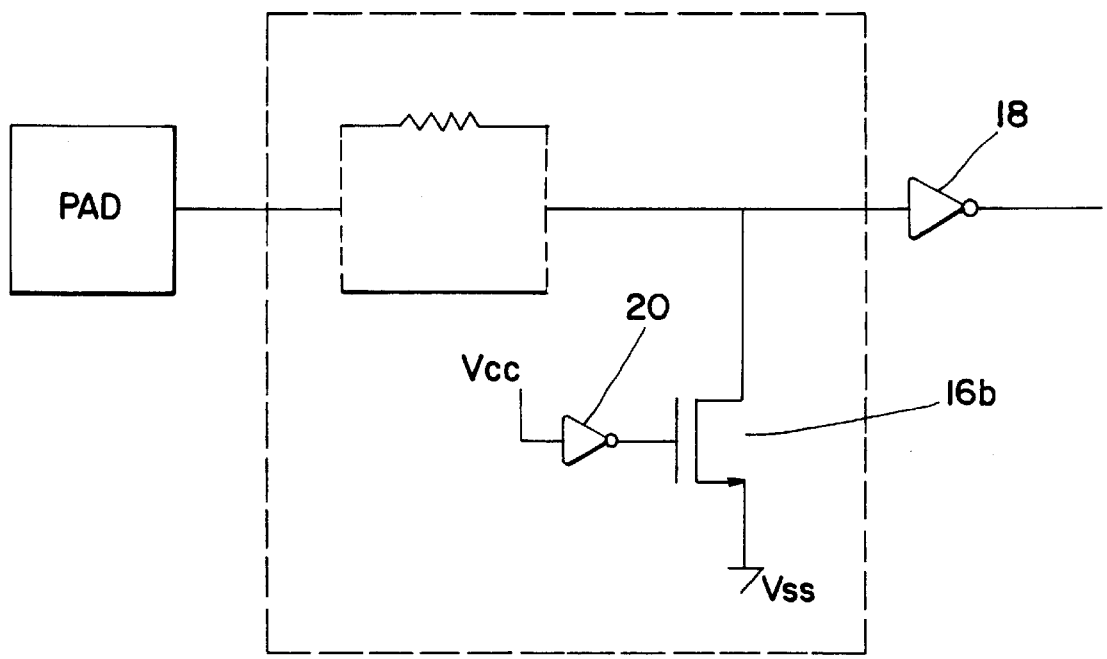
Figure 1D:
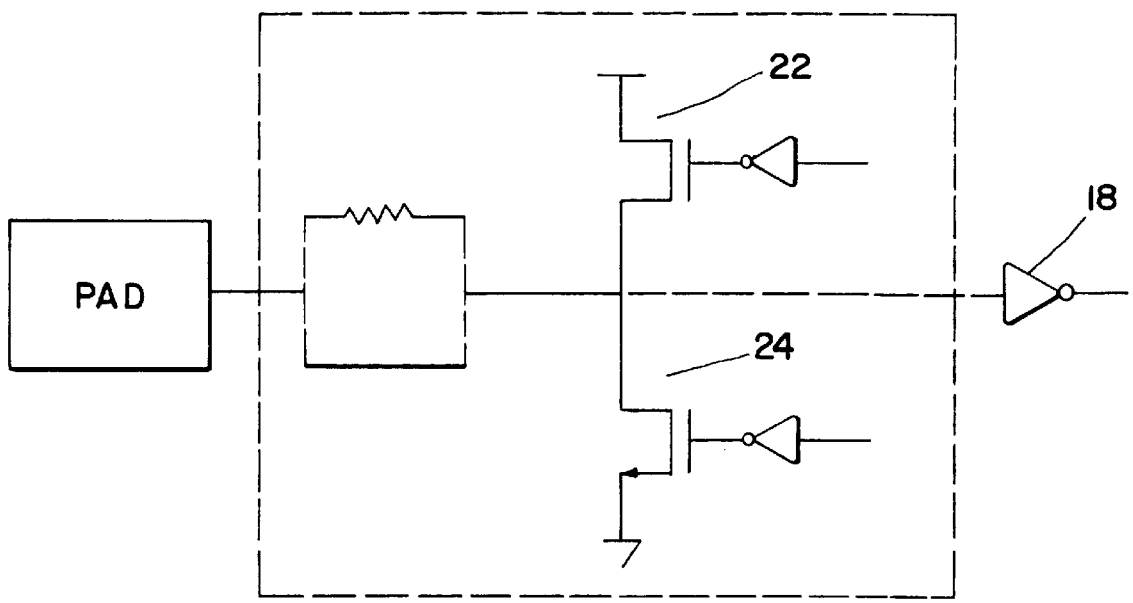
Figure 2A:
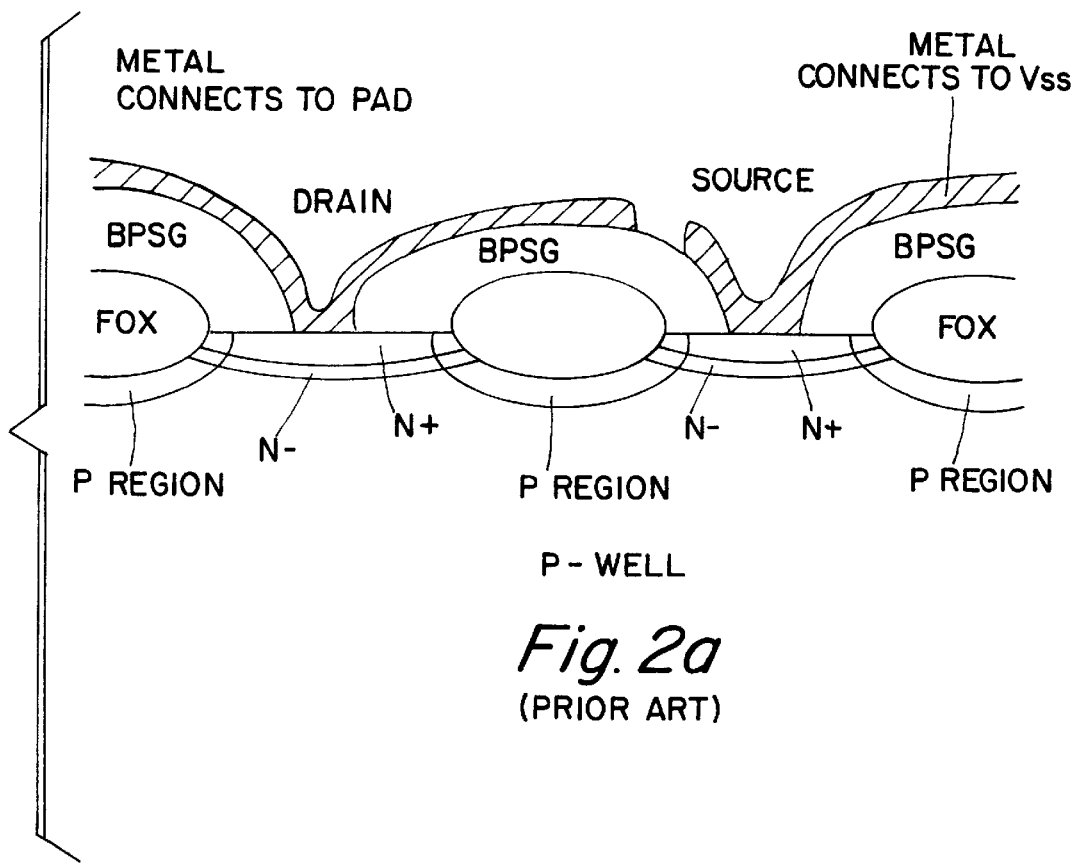
FIG. 2a is a cross sectional view of a field effect transistor formed with a conventional LDD process according to the prior art.
Figure 2B:
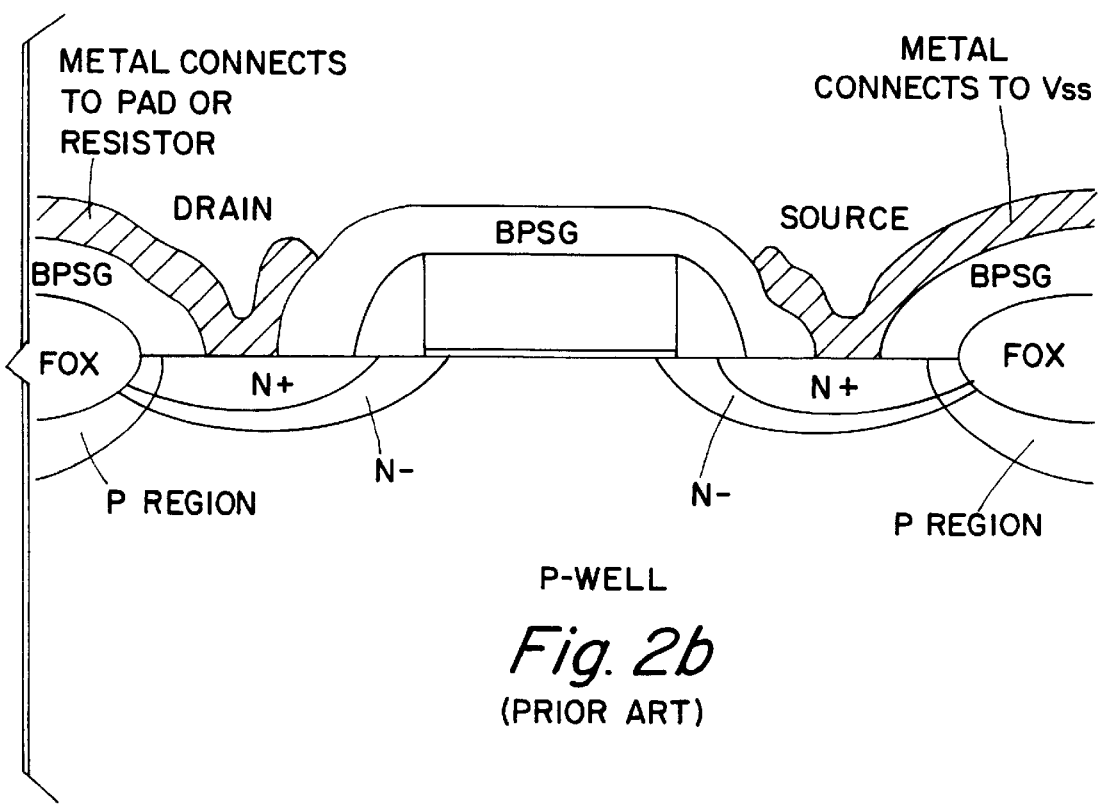
FIG. 2b is a cross sectional view of an NMOS transistor formed in a conventional LDD process according to the prior art.
Figure 5C:
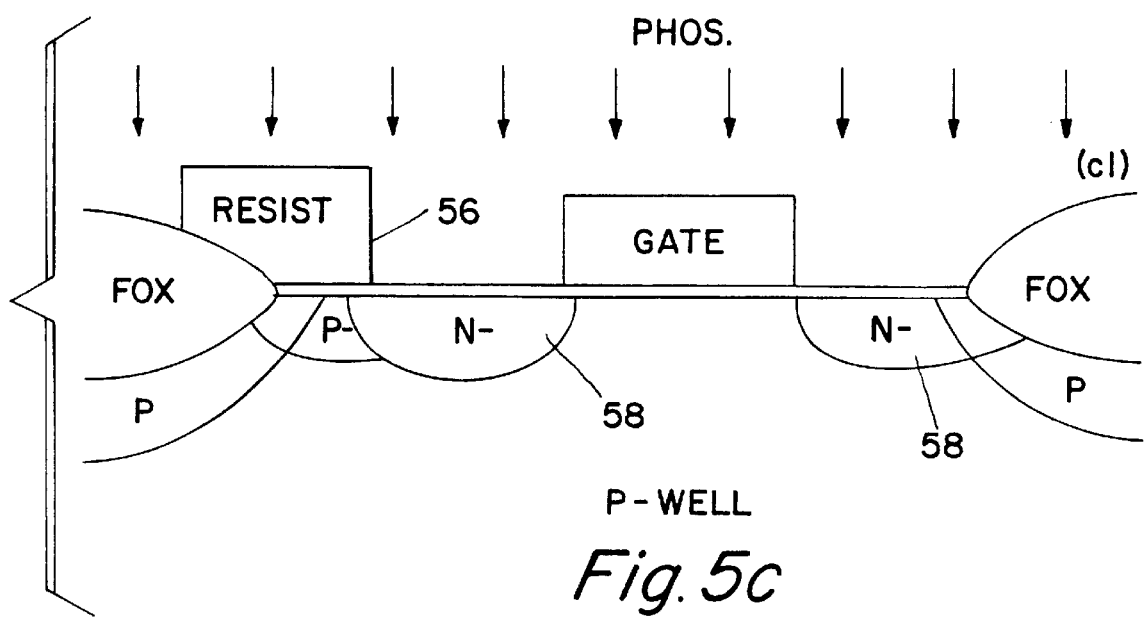
Figure 5D:
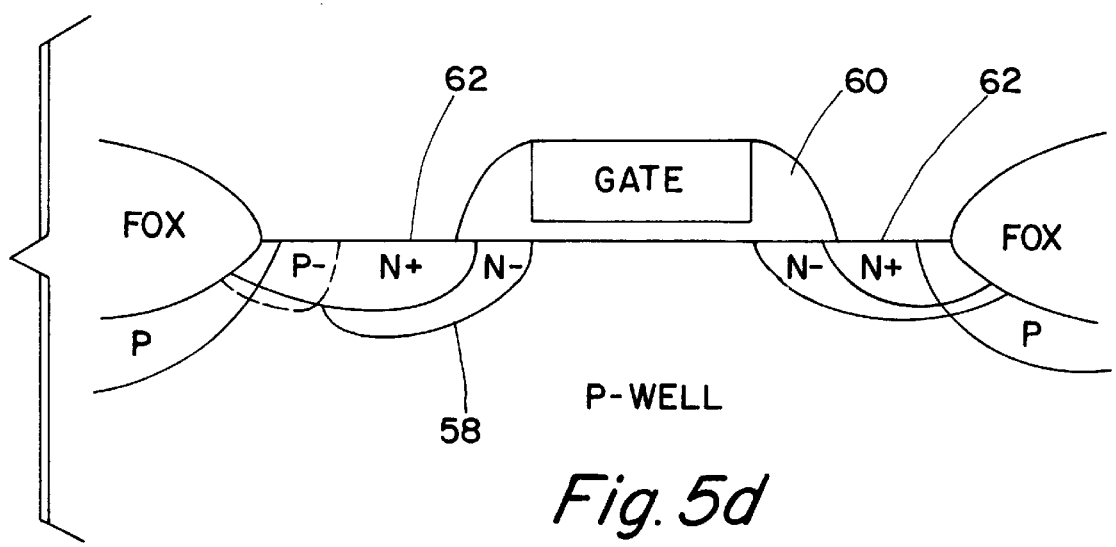

In FIG. 5c, an N-type dopant is implanted into regions that are not masked by the resist 56 and the gate 50 to form the P-N junction shown. The resist preserves a doped region in area 52 that matches the conductivity of well 30A. In FIG. 5d, the P-N junction has a voltage threshold level that is lower than that expected in FIG. 2b, because of the P-region in area 52 adjacent to the well. FIG. 5d illustrates the structure after a spacer 60 is formed surrounding the gate 50, and then an N+ implantation creates N+ regions 62.

FIG. 5d represents a structure further along in processing than FIG. 5c. Thus, as is shown in FIG. 5c, lightly doped P-region is formed in the substrate and separated from the edge of conducting region 50. Moreover, the active area formed in the substrate shown in FIG. 5d has an edge corresponding to region 58(N−) that is aligned with the edge of conducting region 50.

Figure 6A:
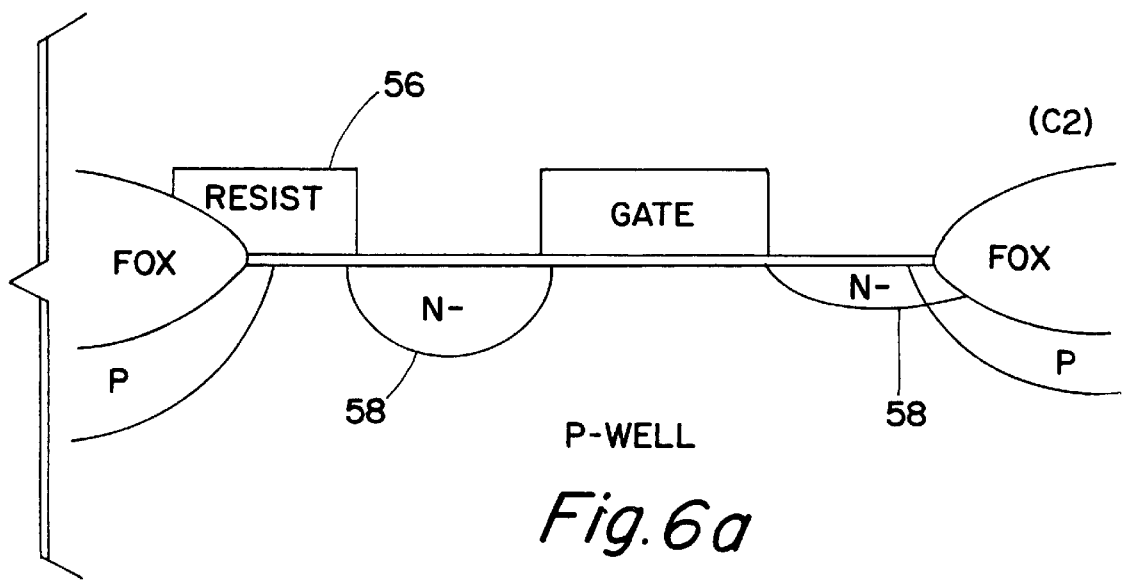
FIG. 6a and 6b illustrate a process for fabricating an NMOS device according to another embodiment of the present invention.
Figure 6B:
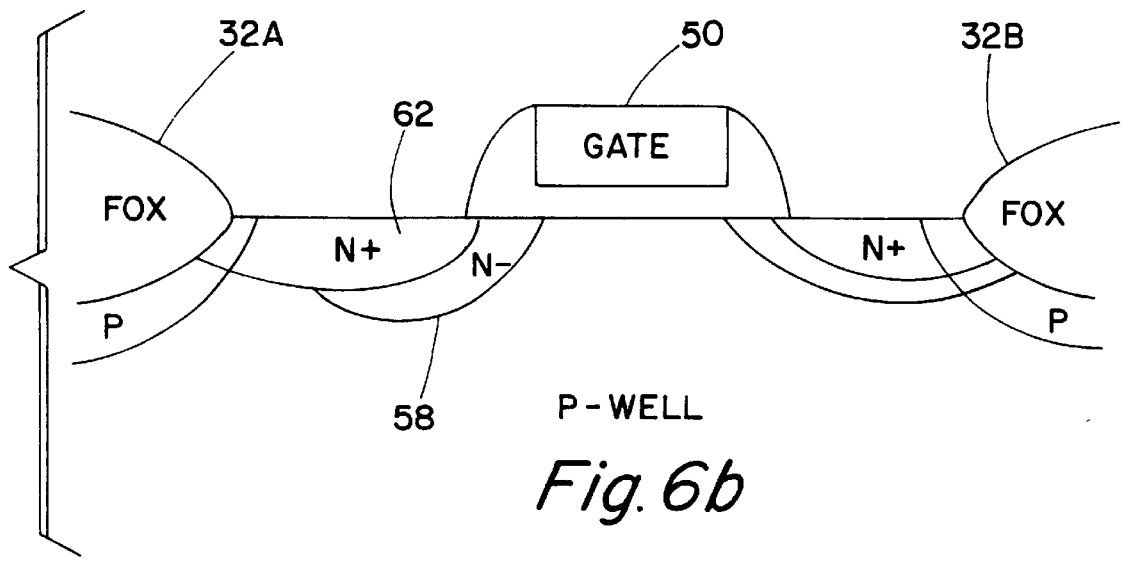

FIG. 6a illustrates in cross-section a structure that was formed using the same process to form the structure in FIG. 5c without a preliminary implantation of a P-type dopant. Thereafter, the resist is removed and a heavy dosage of an N type dopant is implanted to form the structure shown in FIG. 6b.

Figure 7A:
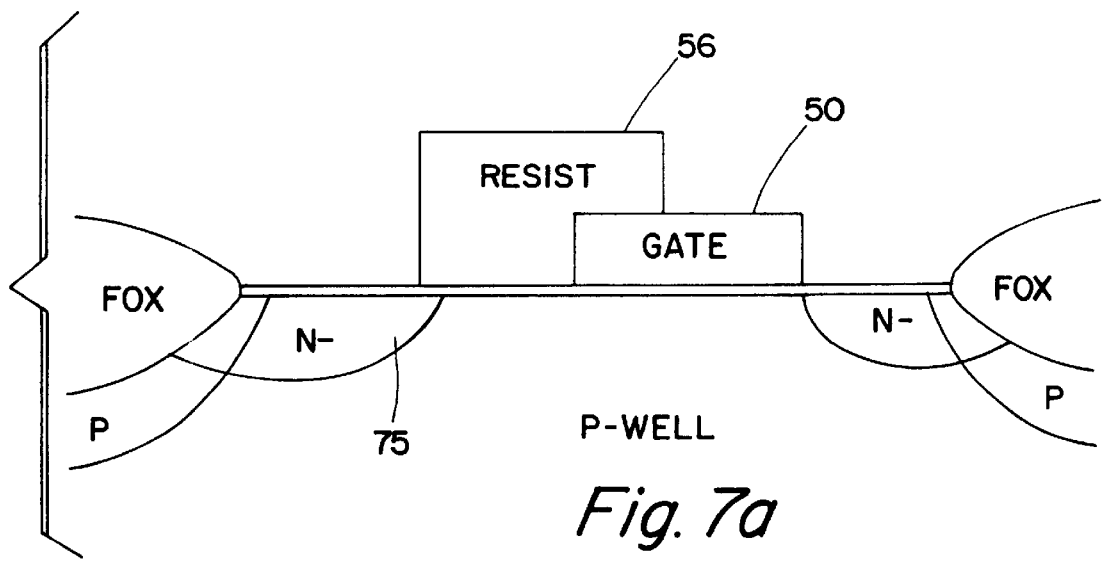
FIGS. 7a and 7b illustrate a process for forming an NMOS device, without the use of a lightly doped drain of opposite conductivity.
Figure 7B:
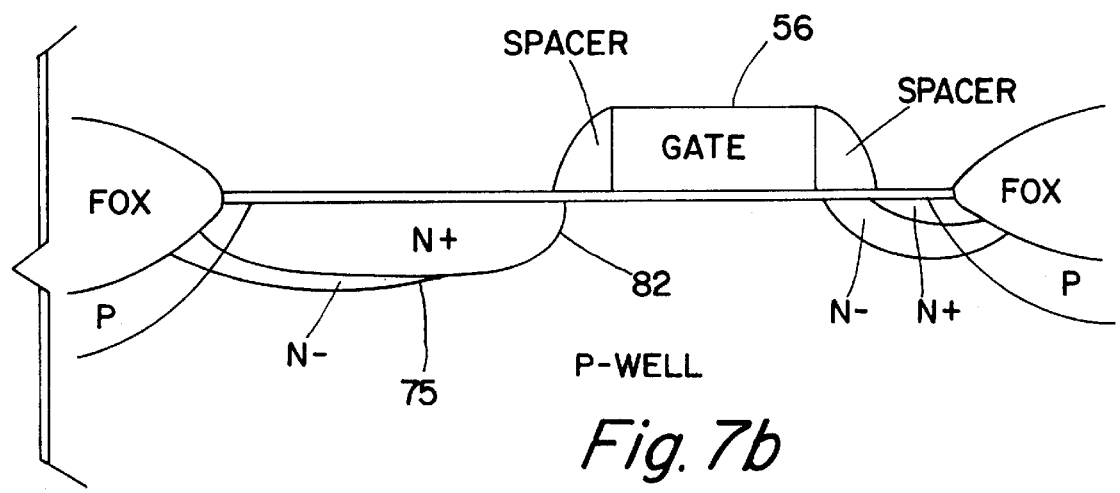

In addition to the field edge doping modifications discussed above, the spacer edge doping profile may also be changed. FIGS. 7a and 7b illustrate how the N-LDD mask can be modified and used for spacer edge doping modification in an NMOS device. In FIG. 7a, a resist layer is formed and patterned such that the phosphorus implantation does not form a N-region under the resist and adjacent to the gate, as shown. This change not only reduces NMOS breakdown voltage, but also moves the N+/P-well junction away from the gate.

Figure 8A:
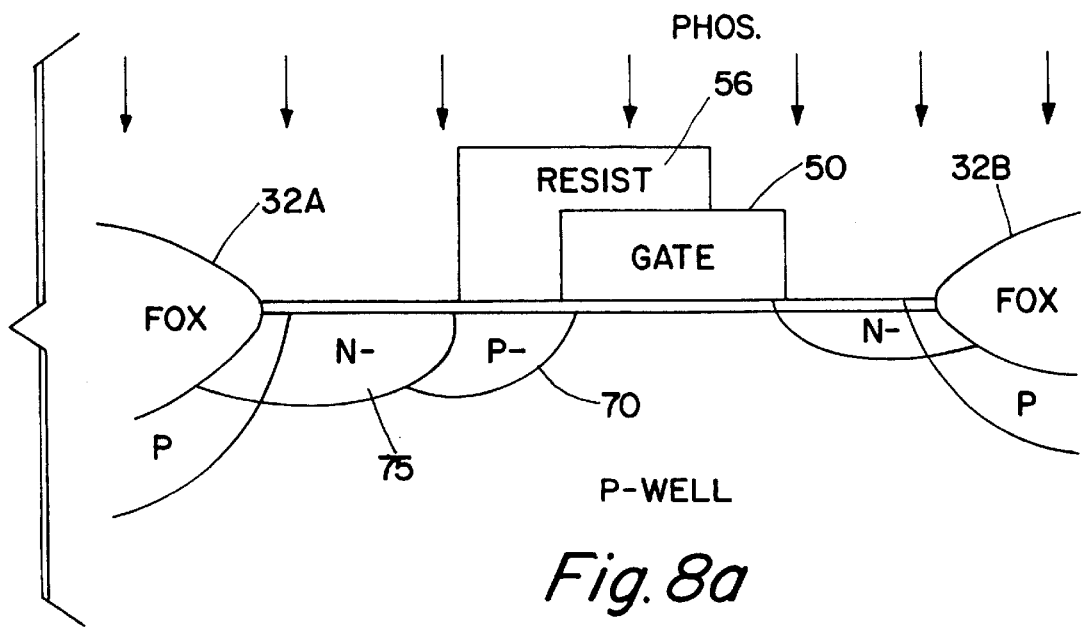
FIGS. 8a and 8b illustrate forming an NMOS structure where the dopant concentration is modified along the edge of the field and the spacer.
Figure 8B:
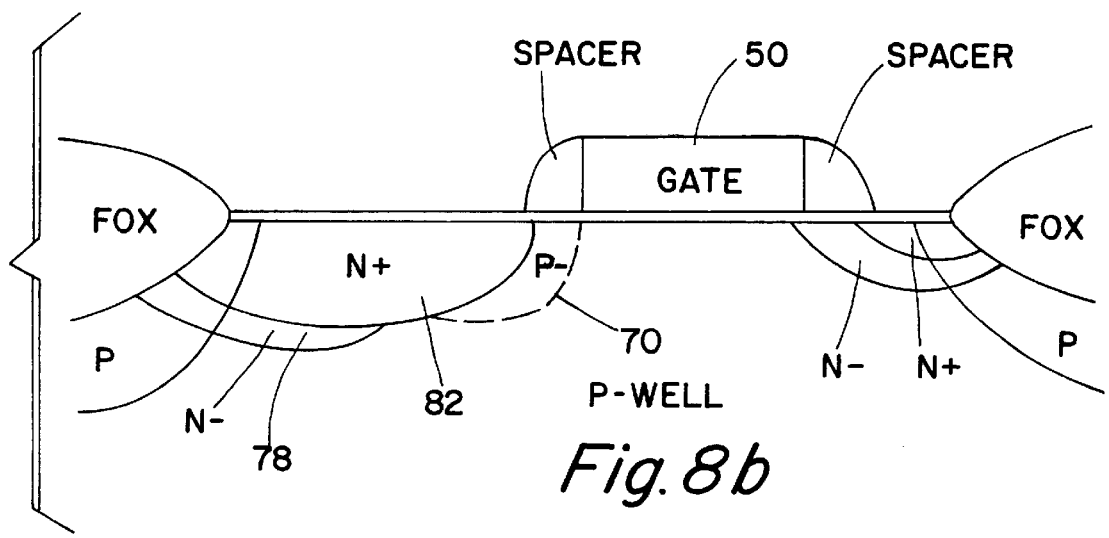

In FIGS. 8a and 8b, a similar effect can be achieved by including a P-lightly doped dopant prior to exposing the resist in a fashion that partially overlaps the gate.

An n-type dopant is then implanted. The n-type implantation lightly dopes the substrate to form the N-regions shown in FIG. 8a. The aforementioned implantation steps result in an active region having an outer edge aligned with the outer edge of the conducting region shown in FIG. 8b. Next, the resist is removed and spacers are formed. Thereafter, an N+ implantation is provided, forming an active region that includes a highly doped area that is separated from the outer edge of the gate by a doped region having a different conductivity than a lightly doped area.

It is known that gate edge damage is one of the major failure mechanisms for an NMOS ESD. By moving the junction away from the gate edge, we have reduced the electrical field around the gate edge thereby eliminating the possibility of gate edge damage.

Figure 9A:
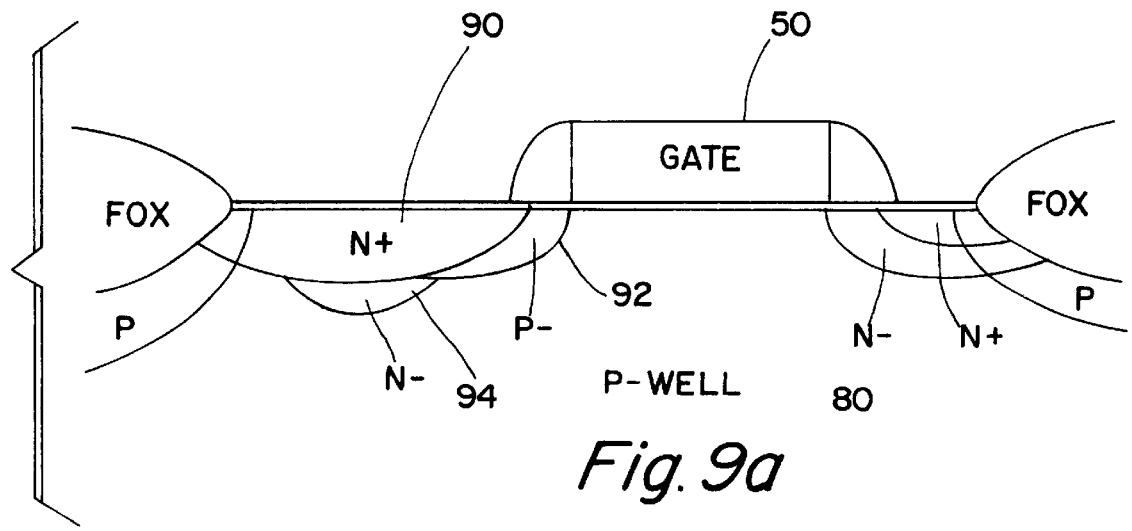
FIGS. 9a and 9b illustrate in cross section a process for fabricating an NMOS junction according to another embodiment of the present invention.
Figure 9B:
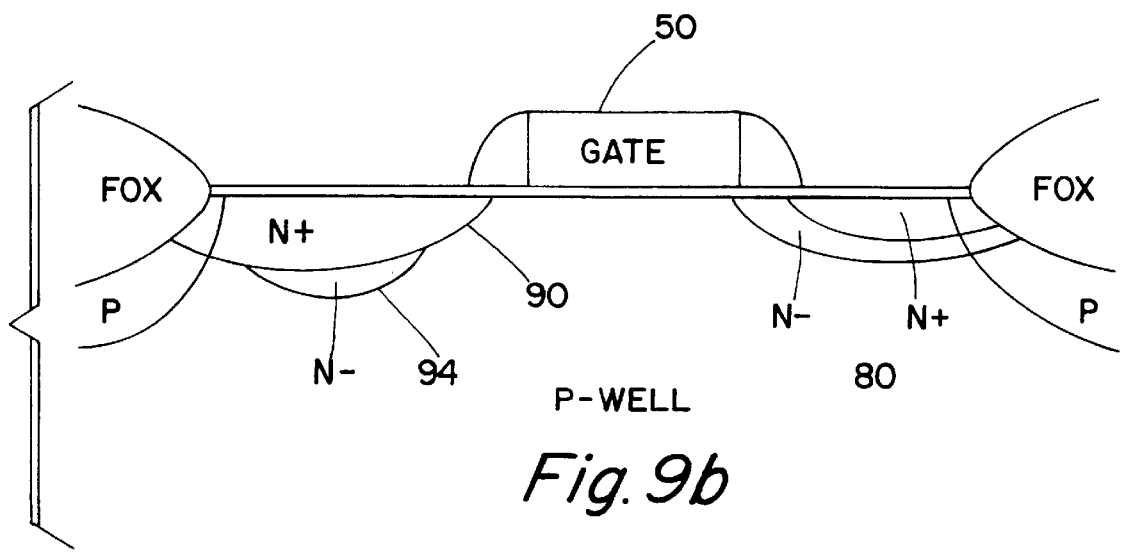

Of course, we can combine both field edge and gate edge modification to gain significant benefits, as shown in FIGS. 9a and 9b.

The present invention also encompasses a semiconductor structure having a conductive region formed on the surface of the substrate. In this embodiment, a first active region is formed in the substrate between and abutting the first field oxide region and a conducting region. A second active region is formed between and abutting the second field oxide region and a conducting region. Alternatively, lightly doped region may be separated form one of the field oxide regions or the conducting region. In a preferred embodiment, the conducting region is a gate structure. One of the active regions may constitute a highly doped region 90 formed near the surface of the substrate 80 as shown in FIG. 9a, and a lightly doped region 94 formed below the heavily doped region 90. Lightly doped region 94 is separated from the gates and may or may not contact the field oxide regions. Alternatively, lightly doped region may be separated from one of the field oxide regions.

Figure 10A:
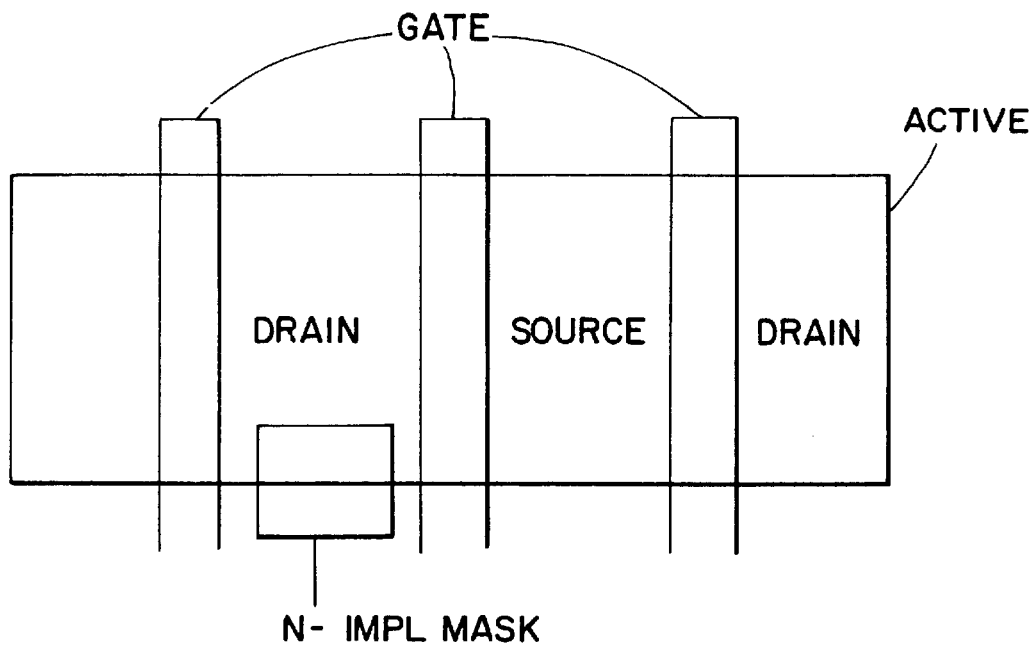
FIGS. 10a and 10b and FIGS. 11a and 11b are top plan views of the implementation of a partial mask to fabricate an NMOS junction according to another embodiment of the present invention.
Figure 10B:
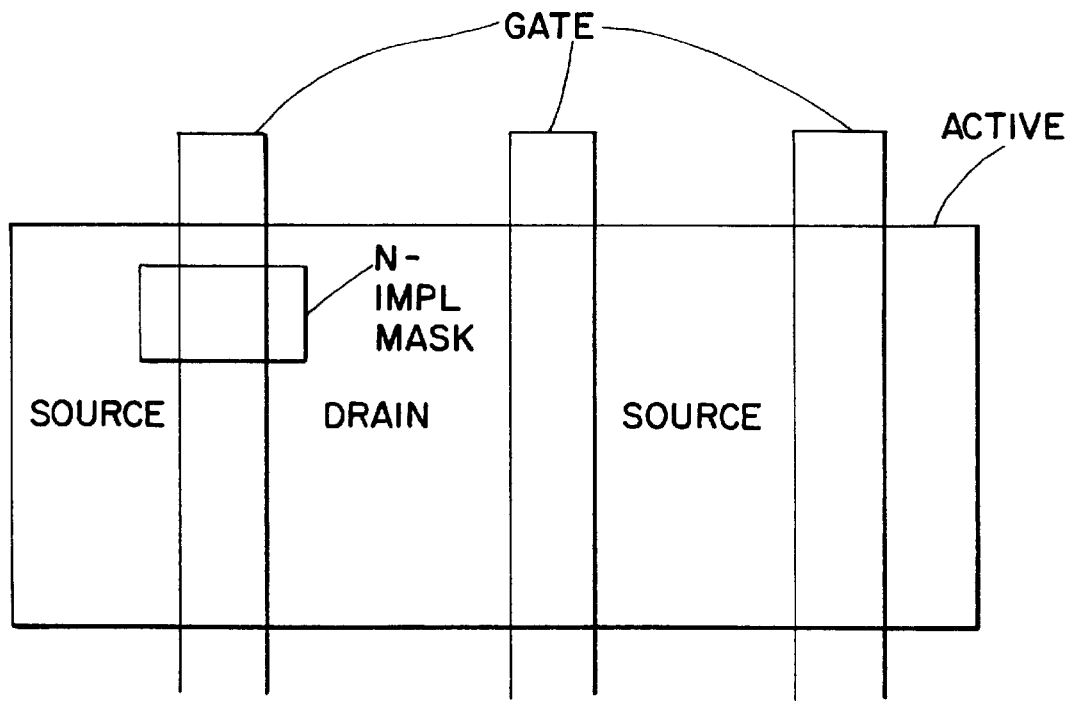
Figure 11A:
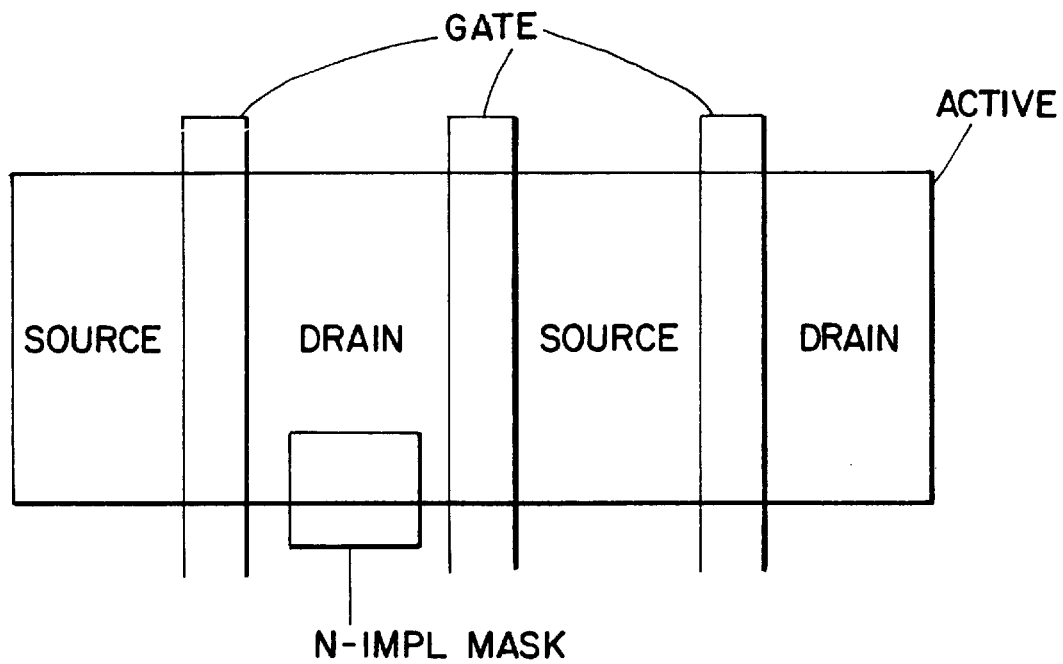
Figure 11B:
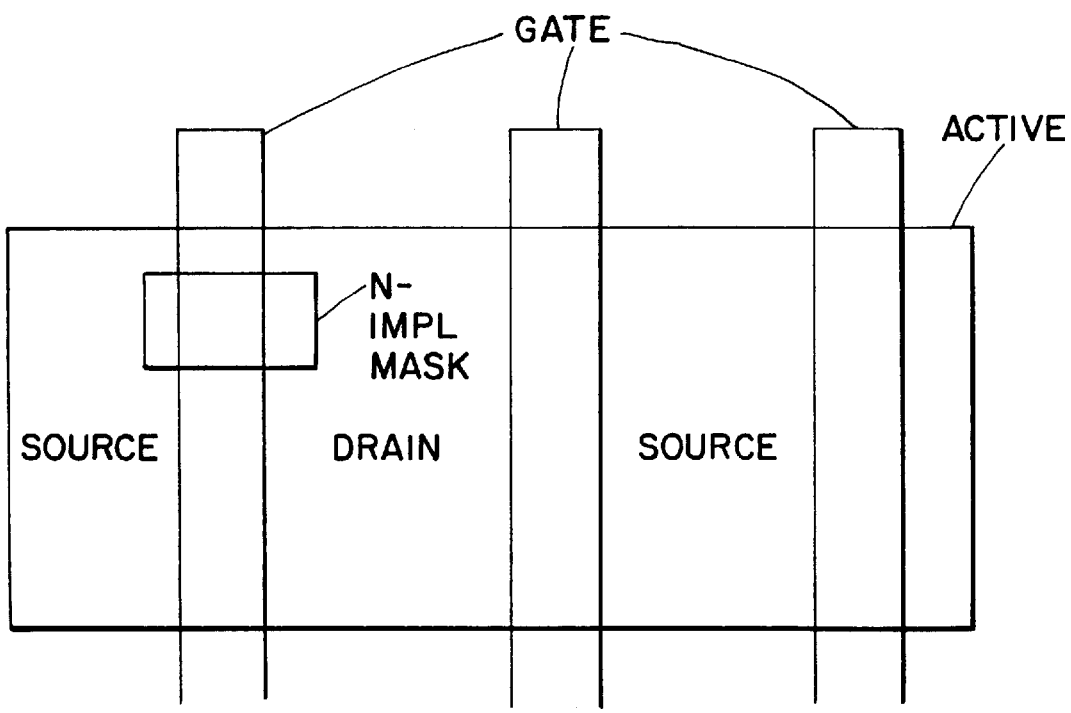

FIGS. 10a and 10b illustrate yet another embodiment for performing the present invention. FIG. 10a illustrates a top view of one way in which a mask can be disposed to cover a portion of the drain and thereby modify only a part of the drain field edge. FIG. 10b illustrates one way in which a mask can be disposed above the gate and a portion of the source and drain region to thereby modify only a part of the drain-spacer edge.

It should be understood that the invention is not intended to be limited by the specifics of the above-described embodiments, but rather should be defined by the accompanying claims.

What is claimed is:

1. A method for fabricating a semiconductor integrated circuit for an electrostatic discharge protection circuit, comprising:

forming a conductive region having an edge near the surface of a semiconductor substrate; and forming an active region laterally adjacent to the edge of the conducting region, wherein said active region is aligned with an edge of the conducting region, said active region comprising a highly doped portion formed near the surface of the substrate and including a lightly doped portion formed below the highly doped portion, said lightly doped portion being separated from the edge of the conducting region.

2. A method for forming a semiconductor device comprising selectively implanting a dopant into a well to form a lightly doped region, wherein one edge of said lightly doped region is blocked with a mask from contacting an isolation region.

3. The method of claim 2, further comprising implanting a heavily doped region above said lightly doped region.

4. The method of claim 3, wherein said lightly doped region and said heavily doped region are of the same conductivity type.

5. A method for forming a semiconductor device, comprising selectively implanting a dopant of a first conductivity type into a well region;

providing a mask prior to lightly implanting a dopant of a second conductivity type; and providing a heavy implantation of a dopant of a second conductivity type into said well region to overlap a portion of said dopant of said first conductivity type and a portion of said dopant of said second conductivity type.

6. The method of claim 5, wherein said mask covers part of an isolation region.

7. The method of claim 5, wherein said dopant of a first conductivity type is n-type, and said dopant of a second conductivity type is p-type.

8. The method of claim 5, wherein said dopant of a first conductivity type is p-type, and said dopant of a second conductivity type is n-type.

9. A method for forming a semiconductor device, comprising selectively implanting a dopant of a first conductivity type into a region;

providing a barrier prior to lightly implanting a dopant of a second conductivity type; and providing a heavy implantation of a dopant of a second conductivity type into said region to overlap a portion of said dopant of said first conductivity type and a portion of said dopant of said second conductivity type, wherein said first conductivity type is different than said second conductivity type.

10. The method of claim 9 wherein said barrier is a mask.

11. The method of claim 9, wherein said dopant of first conductivity type is selectively implanted using a photoresist mask that covers part of an isolation region.

12. A method for forming a semiconductor device, comprising selectively implanting a dopant of a first conductivity type into a substrate using a photoresist mask that covers part of an isolation region;

providing a barrier prior to lightly implanting a dopant of a second conductivity type; and providing a heavy implantation of a dopant of a second conductivity type into said substrate to overlap a portion of said dopant of said first conductivity type and a portion of said dopant of said second conductivity type.

13. The method of claim 5, wherein said dopant of a first conductivity type is n-type, and said dopant of a second conductivity type is p-type.

14. The method of claim 5, wherein said dopant of a first conductivity type is p-type, and said dopant of a second conductivity type is n-type.

* * * * *